US006980048B2

(12) United States Patent
Kwon

(10) Patent No.: US 6,980,048 B2
(45) Date of Patent: Dec. 27, 2005

(54) VOLTAGE GENERATING CIRCUIT CAPABLE OF SUPPLYING STABLE OUTPUT VOLTAGE REGARDLESS OF EXTERNAL INPUT VOLTAGE

(75) Inventor: Kee-won Kwon, Sungnam (KR)

(73) Assignee: Samsung Electronic Co., Ltd., Kyungki-Do (KR)

( * ) Notice: Subject to any disclaimer, the term of this patent is extended or adjusted under 35 U.S.C. 154(b) by 0 days.

(21) Appl. No.: 10/384,557

(22) Filed: Mar. 11, 2003

(65) Prior Publication Data

US 2003/0184362 A1 Oct. 2, 2003

(30) Foreign Application Priority Data

Apr. 2, 2002 (KR) ............................... 2002-18053

(51) Int. Cl.[7] ............................. G05F 1/56; H03L 5/00
(52) U.S. Cl. ....................... 327/541; 327/543; 327/328
(58) Field of Search ............................... 327/108, 538, 327/540, 541, 543, 318, 321, 322, 323, 328; 323/311

(56) References Cited

U.S. PATENT DOCUMENTS 5,742,193 A * 4/1998 Colli et al. ................. 327/170
5,910,924 A * 6/1999 Tanaka et al. .............. 365/226
6,072,742 A * 6/2000 Ooishi ......................... 365/226
6,294,941 B1 * 9/2001 Yokosawa ................... 327/309

FOREIGN PATENT DOCUMENTS

KR 1998-34554 8/1998 ............ G11C 5/14

* cited by examiner

*Primary Examiner*—Timothy P. Callahan
*Assistant Examiner*—Terry L. Englund
(74) *Attorney, Agent, or Firm*—Harness, Dickey & Pierce

(57) ABSTRACT

A voltage generating circuit capable of generating a stable output voltage irrespective of a variation in external voltage. The voltage generating circuit includes a voltage comparing circuit that operates in response to an activation signal and outputs output voltage to a control node in response to a difference between a reference voltage and an internal voltage; an internal voltage control circuit that is connected to the control node, and receives the external voltage and controls the level of the internal voltage, which is applied to a load, in response to a voltage value of the control node, and an adjusting means for adjusting an amount of driving current flowing through the internal voltage control circuit by controlling the voltage level at the control node. The adjusting means may include any combination of a clamp circuit, a voltage compensating circuit, and a voltage drop circuit.

22 Claims, 14 Drawing Sheets

VOLTAGE GENERATING CIRCUIT CAPABLE OF SUPPLYING STABLE OUTPUT VOLTAGE REGARDLESS OF EXTERNAL INPUT VOLTAGE

BACKGROUND OF THE INVENTION

1. Field of the Invention

The present invention relates to a voltage generating circuit, and more particularly, to a voltage generating circuit capable of supplying stable output voltage regardless of a change in external input voltage.

2. Description of the Related Art

In general, the internal voltage in a semiconductor memory device is being reduced. To permit this reduction, a voltage generating circuit is included in a semiconductor memory device to use an external voltage as an internal voltage.

An internal voltage generating circuit for use in a semiconductor memory array is provided a large electric current from a supply driver having an external power source at a point in time when consumption of a large electric current is needed, thereby reducing a change in internal voltage. However, as the level of external voltage in a semiconductor memory device decreases, a difference between the external voltage and internal voltage is lowered.

A reduction in a difference between external voltage and internal voltage results in a reduction in the capability of an internal voltage generating circuit to supply electric current. As a result, the level of the internal voltage decreases, which makes it difficult to design an internal voltage generating circuit capable of supplying a substantially stable output voltage.

If the size of a driver of the internal voltage generating circuit is increased to increase the electric current supply capability of the driver, excessive current may flow through the driver when external voltage increases suddenly and then the internal voltage may be larger than a desired value.

FIG. 1 is a view of a conventional voltage generating circuit 100. FIG. 2 is a circuit diagram of the voltage generating circuit of FIG. 1. FIGS. 3(*a*) and (*b*) are graphs illustrating the relationship between external voltage and gate source voltage in the voltage generating circuit 100, and between the external voltage and a driving electric current.

Referring to FIGS. 1 through 3(*b*), the conventional voltage generating circuit 100 includes a voltage comparing circuit 110 and an internal voltage control circuit 140.

The voltage comparing circuit 110 includes transistors MP0, MP1, MP2, MN0, MN1, MN2, MN3, MN4, MN5 and MN6, illustrated in FIG. 2.

The voltage comparing circuit 110 compares internal voltage VCCA with reference voltage VREF, and generates output voltage VOUT according to a difference therebetween. The internal voltage control circuit 140 is a PMOS transistor that receives the output voltage VOUT via a gate and supplies external voltage VCC to a load 150.

In the event that the current driving capability of the voltage generating circuit 100 is lowered or the internal voltage VCCA in the voltage generating circuit 100 is above or below a desired value, the voltage restoring capability of the voltage generating circuit 100 is proportional to the amount of an electric current flowing through the voltage generating circuit 100. However, preferably, excessive consumption in power of the voltage generating circuit 100 does not occur.

Therefore, in most cases, the voltage generating circuit 100 is designed such that a small amount of an electric current is normally output, but a large electric current is output for a short time if it is required to supply a large electric current to the load 150 or rapidly restore voltage to the original state.

As the voltage comparing circuit 110, a differential amplification circuit 120 is used. In FIG. 1, ENS denotes an activation signal that is activated when a large electric current or fast restoration of voltage is required. If the activation signal ENS is activated, the voltage comparing circuit 110 and the internal voltage control circuit 140 are actuated to maintain the internal voltage VCCA to a desired level.

If the internal voltage VCCA is lower than the reference voltage VREF, the voltage comparing circuit 110 generates the output voltage VOUT to turn on the internal voltage control circuit 140. Then, the external voltage VCC increases a driving current IDRV flowing through the internal voltage control circuit 140, and thus, the internal voltage VCCA can be maintained constantly.

More specifically, a large load current ICCA flows through the load 150, the voltage comparing circuit 110 turns on a gate of the internal voltage control circuit 140, i.e., the PMOS transistor, using an electric current ISRC of the differential amplification circuit 120. As a result, the internal voltage control circuit 140 increases the response speed of the driving current IDRV, thereby preventing a rapid reduction in the internal voltage VCCA.

If the load current ICCA consumed by the load 150 decreases below a predetermined level, the differential amplification circuit 120 operates normally to keep balance between the driving current IDRV and the load current ICCA.

At this time, when the activation signal ENS is activated excessively for a long time and the external voltage VCC is high, the internal voltage VCCA increases abnormally. On the other hand, if the activation signal ENS is activated for too short a time and the external voltage VCC is low, the internal voltage VCC is lowered. Thus, it is important to appropriately control the activation signal ENS. However, control of the activation signal ENS is not easy because there are many factors to account for, e.g., conditions, such as temperature.

Further, the electric current ISRC of the differential amplification circuit 120 is set to be very large so as to rapidly turn on or off a gate of the PMOS transistor 140. In general, the differential amplification circuit 120 is designed such that the electric current ISRC flows through the differential amplification circuit 120 for a relatively long time. This causes unnecessary power consumption in the differential amplification circuit 120.

A current source circuit 130 of the voltage comparing circuit 110 supplies a small amount of an electric current IDDD to reduce the driving current IDRV when the external voltage VCC is high, and supplies a large amount of the electric current IDDD to increase the driving current IDRV when the external voltage VCC is low. That is, the current source circuit 130 is to constantly maintain the amount of the driving current IDRV flowing through the PMOS transistor 140 for a desired time.

However, in fact, the amount of the driving current IDRV flowing through the PMOS transistor 140 is not perfectly constant for a desired time. That is, despite use of the current source circuit 130 in the voltage comparing circuit 110, the driving current IDRV is affected by variations in the external voltage VCC.

Recently, the external voltage VCC has been lowered to a range from 2.5 V to 1.8 V, and as a result, a difference between the external voltage VCC and the internal voltage VCCA is reduced to several hundred mV. In this case, even if a gate of the PMOS transistor 140 is rapidly turned on or off, the driving current IDRV is proportional to the external voltage VCC because the PMOS transistor 140 operates in a triode region. This is illustrated in the graphs (a) and (b) shown in FIG. 3.

In a large PMOS transistor 140, the internal voltage VCCA does not decrease much although the external voltage VCC is low, but overshooting occurs when the external voltage VCC is high. On the contrary, in a small PMOS transistor 140, overshooting rarely occurs even if the external voltage VCC is high, but the internal voltage VCCA decreases significantly when the external voltage VCC is low.

Accordingly, a driving current IDRV that is not affected by variations in the external voltage VCC would be beneficial since the load current ICCA consumed by the load 150 is regular irrespective of the external voltage VCC.

SUMMARY OF THE INVENTION

In an exemplary embodiment, the present invention provides a voltage generating circuit capable of supplying a stable output voltage independent from a variation in external voltage.

In another exemplary embodiment, the present invention is directed to a voltage generating circuit for generating a stable internal voltage irrespective of a variation in external voltage, the voltage generating circuit including a voltage comparing circuit that operates in response to an activation signal and outputs output voltage to a control node in response to a difference between a reference voltage and an internal voltage; an internal voltage control circuit that is connected to the control node and receives external voltage and controls the level of the internal voltage, which is applied to a load, in response to voltage level at of the control node; and a clamp circuit for adjusting the amount of a driving current flowing through the internal voltage control circuit by controlling the voltage level of the control node.

In another exemplary embodiment, the clamp circuit is a diode that has a first end connected to the external voltage, and a second end connected to the control node in response to the activation signal and controls voltage in the control node not to increase above a desired level.

In another exemplary embodiment, the clamp circuit includes a first clamp PMOS transistor having a source connected to the external voltage and a gate connected to the activation signal; a first clamp NMOS transistor having a drain connected to a drain of the first clamp PMOS transistor, a gate connected to the activation signal, and a source connected to the control node; a second clamp PMOS transistor having a source connected to the drain of the first clamp PMOS transistor, a gate connected to an inversion signal of the activation signal, and a drain connected to the control node; and a third clamp PMOS transistor having a source connected to the external voltage, a gate connected to the drain of the first clamp PMOS transistor, and a drain connected to the control node.

In another exemplary embodiment, the voltage generating circuit may further include a voltage compensating circuit that operates in response to the activation signal and adjusts the amount of the driving current by controlling the voltage level of the voltage in the control node when the external voltage exceeds a desired voltage level. The voltage compensating circuit operates in response to the activation signal and suppresses an increase in the driving current by raising the level of the voltage in the control node when the external voltage is higher than a desired voltage.

In another exemplary embodiment, the voltage compensating circuit includes a first compensating PMOS transistor having a source connected to the external voltage, and a gate connected to the activation signal; a second compensating PMOS transistor having a source connected to the external voltage, a gate connected to a drain of the first compensating PMOS transistor, and a drain connected to the control node; and a third compensating PMOS transistor having a source connected to predetermined bias voltage, a gate connected to an inversion signal of the activation signal, and drain connected to the gate of the second compensating PMOS transistor.

In another exemplary embodiment, the internal voltage control circuit is a PMOS transistor having a source connected to the external voltage and a gate connected to the control node and that generates the internal voltage in its drain. In another exemplary embodiment, the driving current is a source-drain current of the PMOS transistor. In another exemplary embodiment, the activation signal is activated in response to the operation timing of the load.

In another exemplary embodiment, the present invention is directed to a voltage generating a circuit for generating stable internal voltage irrespective of a variation in external voltage, the voltage generating circuit including a voltage comparing circuit that operates in response to an activation signal and outputs output voltage to a control node in response to a difference between reference voltage and internal voltage; an internal voltage control circuit that is connected to the control node, receives an external voltage, and controls the level of the internal voltage, which is applied to a load, in response to a voltage level at the control node; and a voltage drop circuit operating in response to the activation signal and for adjusting the amount of a driving current flowing through the internal voltage control circuit by controlling the voltage in the control node in the event that the external voltage reaches below a desired level.

In another exemplary embodiment, the voltage drop circuit operates in response to the activation signal and increases the driving current by dropping the voltage in the control node when the external voltage is lower than a desired voltage.

In another exemplary embodiment, the voltage drop circuit includes a first drop PMOS transistor having a source connected to the internal voltage, and a gate connected to an inversion signal of the activation signal; a first drop NMOS transistor having a drain connected to a drain of the first drop PMOS transistor, a gate connected to the external voltage, and a source connected to the ground; and a second drop NMOS transistor having a drain connected to the control node, a gate connected to the drain of the first drop PMOS transistor, and a source connected to the ground.

In another exemplary embodiment, the internal voltage control circuit is a PMOS transistor having a source connected to the external voltage and a gate connected to the control node, and that generates the internal voltage in its drain. In another exemplary embodiment, the driving current is a source-drain current of the PMOS transistor. In another exemplary embodiment, the activation signal is activated in response to the operation timing of the load.

In another exemplary embodiment, the present invention is directed to a voltage generating circuit for generating stable internal voltage irrespective of a variation in external voltage, the voltage generating circuit including a voltage comparing circuit that operates in response to an activation signal and outputs an output voltage in response to a difference between a reference voltage and an internal voltage; an internal voltage control circuit that is connected to the control node, receives external voltage and controls the level of the internal voltage, which is applied to a load, in response to a voltage level at the control node; a clamp circuit for adjusting the amount of a driving current flowing through the internal voltage control circuit by controlling the level of the voltage in the control node; and a voltage drop circuit that operates in response to the activation signal and adjusts the amount of the driving current by controlling the voltage level at the control node when the external voltage is lower than a desired voltage.

In another exemplary embodiment, the clamp circuit is a diode that has a first end connected to the external voltage and a second end connected to the control node in response to the activation signal, and controls the voltage in the control node not to increase above a desired level.

In another exemplary embodiment, the clamp circuit includes a first clamp PMOS transistor having a source connected to the external voltage and a gate connected to the activation signal; a first clamp NMOS transistor having a drain connected to a drain of the first clamp PMOS transistor, a gate connected to the activation signal, and a source connected to the control node; a second clamp PMOS transistor having a source connected to the drain of the first clamp PMOS transistor, a gate connected to an inversion signal of the activation signal, and a drain connected to the control node; and a third clamp PMOS transistor having a source connected to the external voltage, a gate connected to the drain of the first clamp PMOS transistor, and a drain connected to the control node.

In another exemplary embodiment, the voltage drop circuit operates in response to the activation signal, and increases the driving current by dropping voltage in the control node in the event that the external voltage is lower than predetermined voltage.

In another exemplary embodiment, the voltage drop circuit includes a first drop PMOS transistor having a source connected to the internal voltage, and a gate connected to an inversion signal of the activation signal; a first drop NMOS transistor having a drain connected to a drain of the first drop PMOS transistor, a gate connected to the external voltage and a source connected to the ground; and a second drop NMOS transistor having a drain connected to the control node, a gate connected to the drain of the first drop PMOS transistor, and a source connected to the ground.

In another exemplary embodiment, the voltage generating circuit may further include a voltage compensating circuit operating in response to the activation signal, and for adjusting the amount of the driving current by controlling the level of the voltage in the control node in the event that the external voltage is higher than a desired voltage. The voltage compensating circuit operates in response to the activation signal and suppresses an increase in the driving current by raising the level of the voltage in the control node in the event that the external voltage reaches above a desired voltage level.

In another exemplary embodiment, the voltage compensating circuit includes a first compensating PMOS transistor having a source connected to the external voltage, and a gate connected to the activation signal; a second compensating PMOS transistor having a source connected to the external voltage, a gate connected to a drain of the first compensating PMOS transistor, and a drain connected to the control node; and a third compensating PMOS transistor having a source connected to a bias voltage, a gate connected to an inversion signal of the activation signal, and a drain connected to the gate of the second compensating PMOS transistor.

In another exemplary embodiment, the internal voltage circuit is a PMOS transistor that has a source connected to the external voltage and a gate connected to the control node and generates the internal voltage at its drain. In another exemplary embodiment, the driving current is a source-drain current of the PMOS transistor. In another exemplary embodiment, the activation signal is activated in response to the operation timing of the load.

In another exemplary embodiment, the present invention is directed to a voltage generating circuit for generating a stable internal voltage irrespective of a variation in external voltage, the voltage generating circuit comprising: a voltage comparing circuit operating in response to an activation signal and for outputting an output voltage to a control node in response to a difference between a reference voltage and an internal voltage; an internal voltage control circuit connected to the control node, the internal voltage control circuit receiving the external voltage and controlling a level of the internal voltage, which is applied to a load, in response to a voltage level at the control node; and a voltage compensating circuit operating in response to the activation signal and for adjusting the amount of driving current by controlling the voltage level at the control node in the even that the external voltage exceeds a desired voltage.

In another exemplary embodiment, the present invention is directed to a voltage generating circuit for generating a stable internal voltage irrespective of a variation in external voltage, the voltage generating circuit comprising: a voltage comparing circuit operating in response to an activation signal and for outputting an output voltage to a control node in response to a difference between a reference voltage and an internal voltage; an internal voltage control circuit connected to the control node, the internal voltage control circuit receiving the external voltage and controlling a level of the internal voltage, which is applied to a load, in response to a voltage level at the control node; and adjusting means for adjusting an amount of driving current flowing through the internal voltage control circuit by controlling the voltage level at the control node.

In another exemplary embodiment, the adjusting means includes a clamp circuit for adjusting an amount of driving current flowing through the internal voltage control circuit by controlling the voltage level at the control node.

In another exemplary embodiment, the adjusting means includes a voltage compensating circuit operating in response to the activation signal and for adjusting the amount of driving current by controlling the voltage level at the control node in the event that the external voltage exceeds a desired voltage.

In another exemplary embodiment, the adjusting means includes a voltage drop circuit operating in response to the activation signal and for adjusting an amount of driving current flowing through the internal voltage control circuit by controlling the voltage level at the control node in the event that the external voltage falls below a desired level.

In another exemplary embodiment, the adjusting means includes a clamp circuit and a voltage compensating circuit operating in response to the activation signal and for adjusting the amount of driving current by controlling the voltage level at the control node in the event that the external voltage exceeds a desired voltage.

In another exemplary embodiment, the adjusting means includes a voltage compensating circuit and a voltage drop circuit operating in response to the activation signal and for adjusting the amount of driving current flowing through the internal voltage control circuit by controlling the voltage level at the control node in the event that the external voltage falls below a desired voltage.

In another exemplary embodiment, the adjusting means includes a clamp circuit and a voltage drop circuit operating in response to the activation signal and for adjusting the amount of driving current by controlling the voltage level at the control node in the event that the external voltage exceeds a desired voltage.

In another exemplary embodiment, the adjusting means includes a clamp circuit, a voltage compensating circuit and a voltage compensating circuit operating in response to the activation signal and for adjusting the amount of the driving current flowing through the internal voltage control circuit by controlling the voltage level at the control node when the external voltage is higher than the desired voltage.

Therefore, a voltage generating circuit in exemplary embodiments of the present invention can maintain an internal voltage independent of a variation in external voltage.

BRIEF DESCRIPTION OF THE DRAWINGS

The present invention will become more apparent by describing in detail exemplary embodiments thereof with reference to the attached drawings in which:

FIG. 6(B) is a graph showing the relationship between external voltage and driving current in the voltage generating circuit of FIG. 4;

FIG. 8(B) is a graph showing the relationship between external voltage and driving current of FIG. 1;

DETAILED DESCRIPTION OF EXEMPLARY EMBODIMENTS OF THE INVENTION

Figure 4:
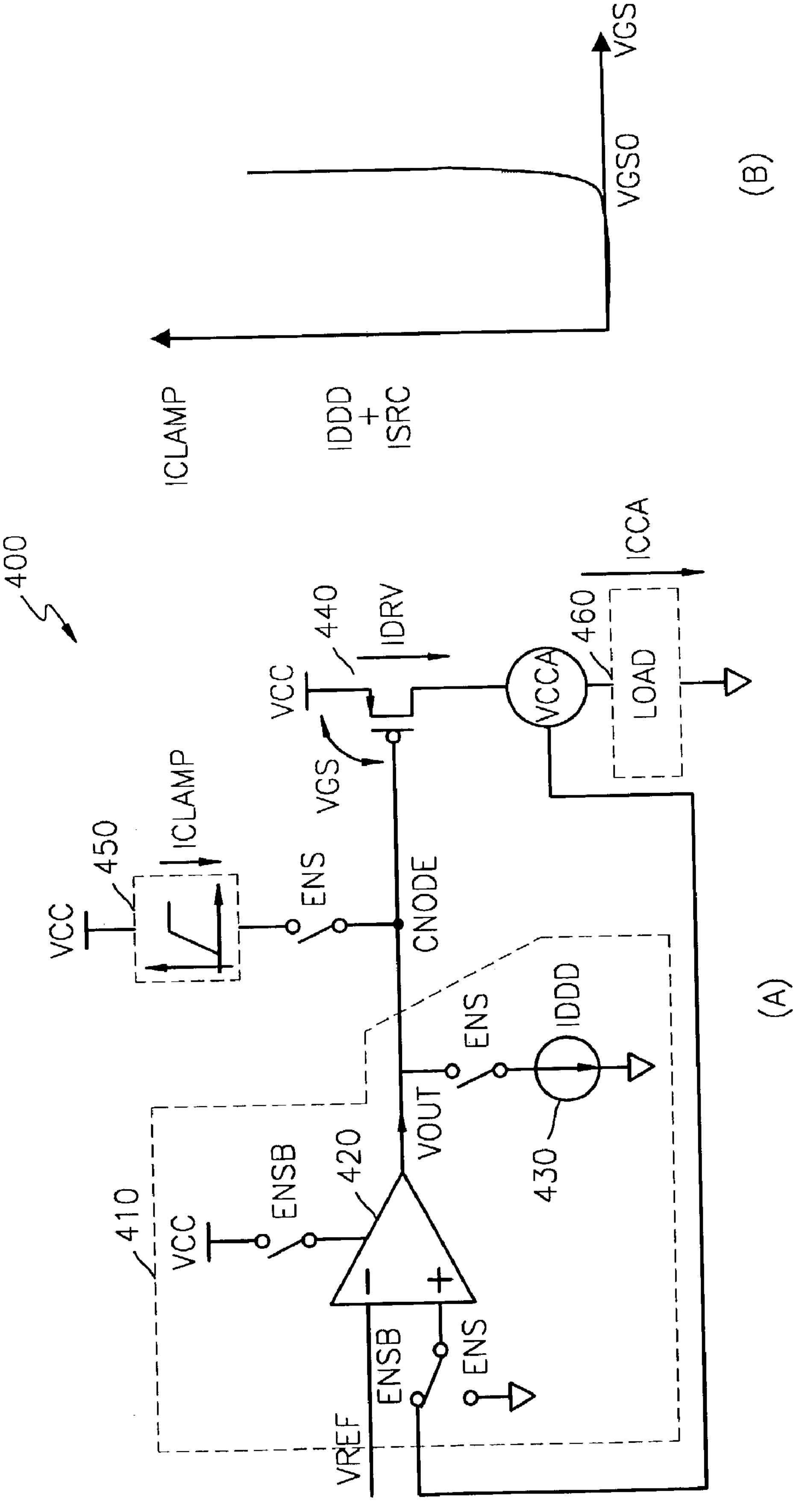
FIGS. 4(*a*) and 4(*b*) are a view of an exemplary embodiment of a voltage generating circuit according to the present invention.
Figure 5:
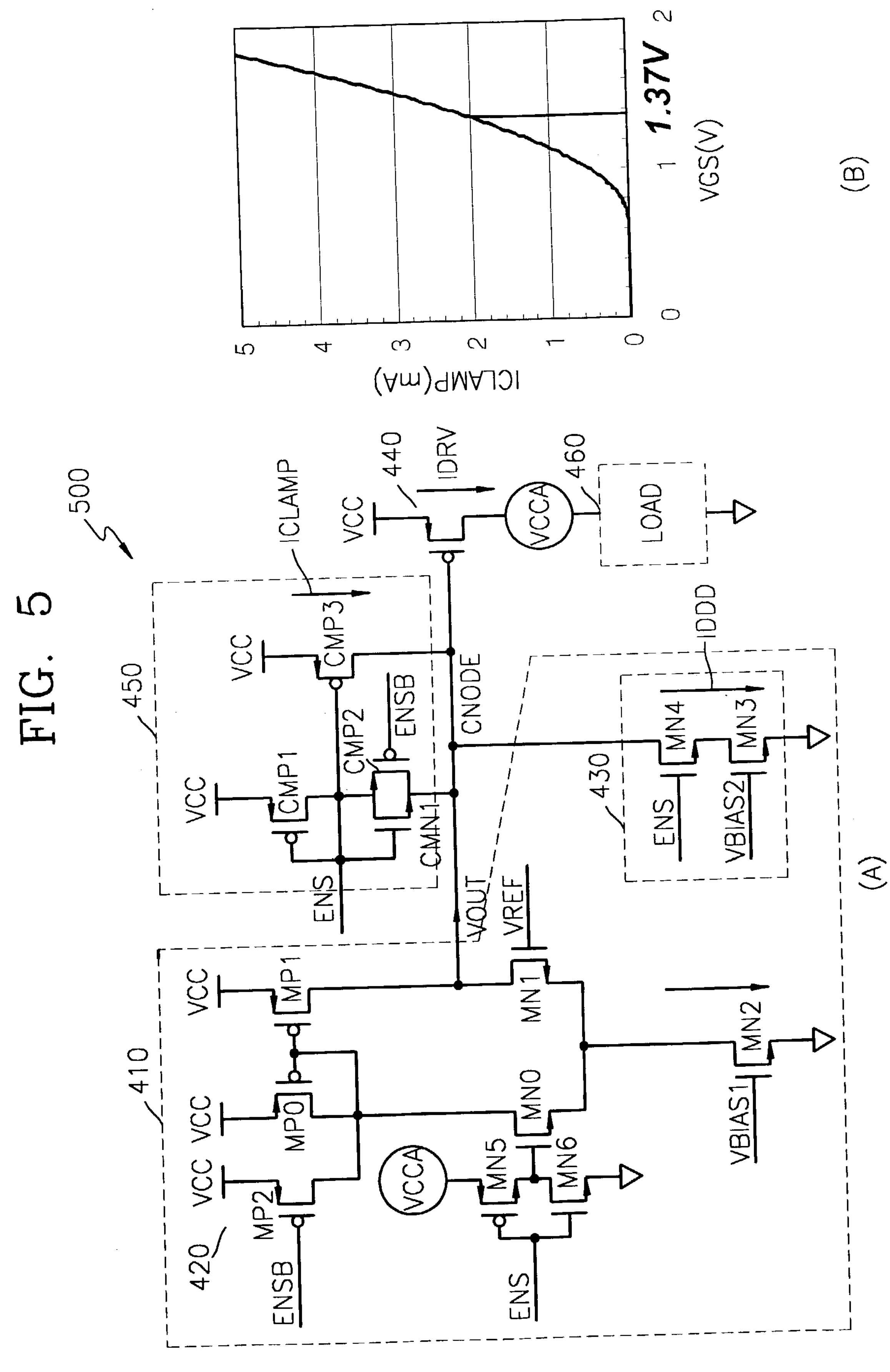
FIGS. 5(*a*) and 5(*b*) are a circuit diagram of the voltage generating circuit of FIG. 1.
Figure 6:
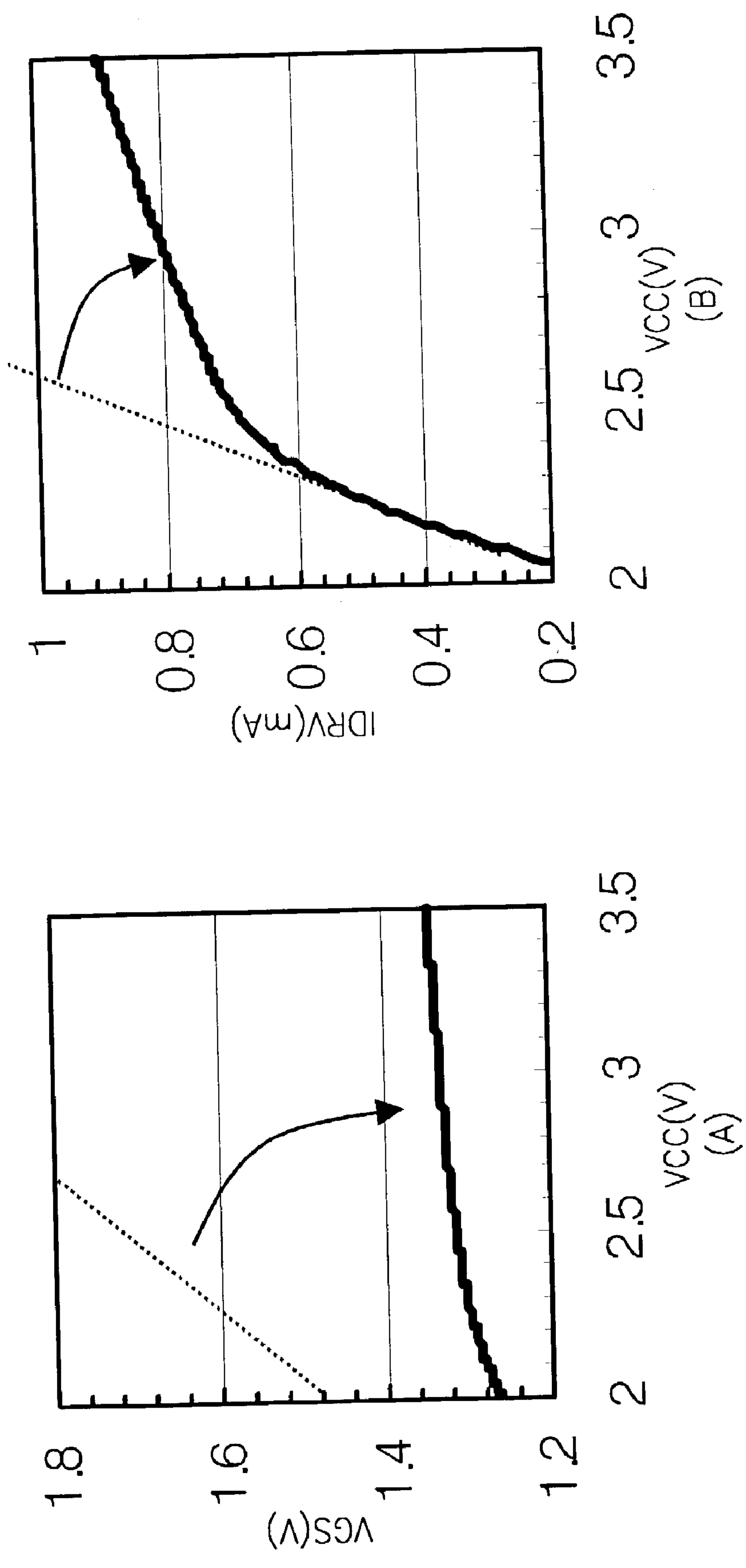
FIG. 6(*a*) is a graph showing the relationship between external voltage and gate source voltage in the voltage generating circuit of FIG. 4.

Referring to FIGS. 4 through 6, an exemplary embodiment of a voltage generating circuit 400 includes a voltage comparing circuit 410, an internal voltage control circuit 440, and a clamp circuit 450.

The voltage comparing circuit 410 includes transistors MP0, MP1, MP2, MN0, MN1, MN2, MN3, MN4, MN5 and MN6, illustrated in FIG. 5.

The voltage comparing circuit 410 is actuated in response to an activation signal ENS, and outputs an output voltage VOUT to a control node CNODE in response to a difference between reference voltage VREF and internal voltage VCCA.

The activation signal ENS is activated in response to the operation timing of a load 460. For instance, when the load 460 reaches a timing that a large electric current is to be consumed, the activation signal ENS is activated to an activation level and operates the voltage comparing circuit 410. Here, the activation level may be a high level or a low level, depending on the structure of the voltage comparing circuit 410.

The voltage comparing circuit 410 may include a differential amplification circuit and be actuated when the activation signal ENS reaches the activation level. More specifically, the voltage comparing circuit 410 compares the internal voltage VCCA with the reference voltage VREF, and generates the output voltage VOUT to turn on the internal voltage control circuit 440 when the internal voltage VCCA is lower than the reference voltage VREF.

Then, a driving current IDRV flowing through the internal voltage control circuit 440 is increased by the external voltage VCC, and as a result, the internal voltage VCCA is maintained constantly. Such an operation of the voltage comparing circuit 410, i.e., the differential amplification circuit, may be easily derived by those skilled in this art, and therefore, description on its operations will be omitted here.

The internal voltage control circuit 440 receives the external voltage VCC, is connected to the control node CNODE, and controls the level of the internal voltage VCCA applied to the load 460 in response to a voltage of the control node CNODE.

The internal voltage control circuit 440 may be a PMOS transistor whose source and gate are connected to the external voltage VCC and the control node CNODE, respectively, and that generates the internal voltage VCCA in its drain.

In another exemplary embodiment, the clamp circuit 450 controls the amount of the driving current IDRV flowing through the internal voltage control circuit 440 by controlling a voltage in the control node CNODE. Here, the driving current IDRV is a source-drain current of the PMOS transistor 440.

In another exemplary embodiment, the clamp circuit 450 includes a diode whose first stage is connected to the external voltage VCC, whose second stage is connected to the control node CNODE in response to the activation signal ENS, and controls the voltage in the control node CNODE not to increase above a desired voltage.

In another exemplary embodiment, the clamp circuit 450 includes a first clamp PMOS transistor CMP1, a first clamp NMOS transistor CMN1, a second clamp PMOS transistor CMP2, and a third clamp PMOS transistor CMP3.

In the exemplary embodiment of FIG. 5, a source and gate of the first clamp PMOS transistor CMP1 are connected to the external voltage VCC and the activation signal ENS, respectively. A drain of the first clamp NMOS transistor CMN1 is connected to a drain of the first clamp PMOS transistor CMP1, its gate is connected to the activation signal ENS, and its source is connected to the control node CNODE.

In the exemplary embodiment of FIG. 5, a source, gate and drain of the second clamp PMOS transistor CMP2 are connected to the drain of the first clamp PMOS transistor CMP1, an inversion signal ENSB of the activation signal ENS, and the control node CNODE, respectively. A source, gate and drain of the third clamp PMOS transistor CMP3 are connected to the external voltage VCC, the drain of the first clamp PMOS transistor CMP1, and a drain connected to the control node CNODE, respectively.

The operation of this exemplary embodiment of a voltage generating circuit according to the present invention will be described in detail with reference to FIGS. 4 through 6.

Figure 1:
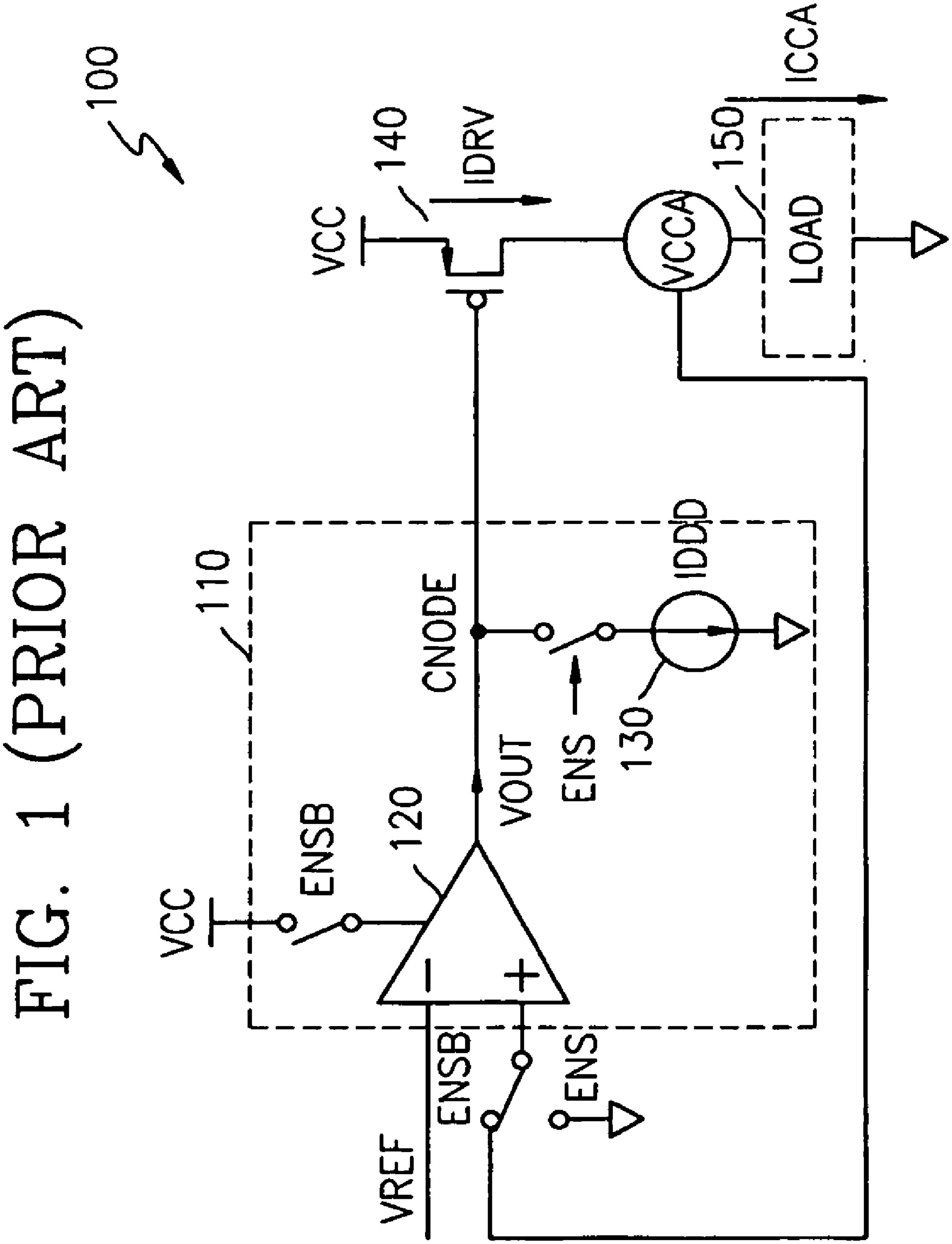
FIG. 1 (PRIOR ART)
FIG. 1 is a view of a conventional voltage generating circuit.
Figure 2:
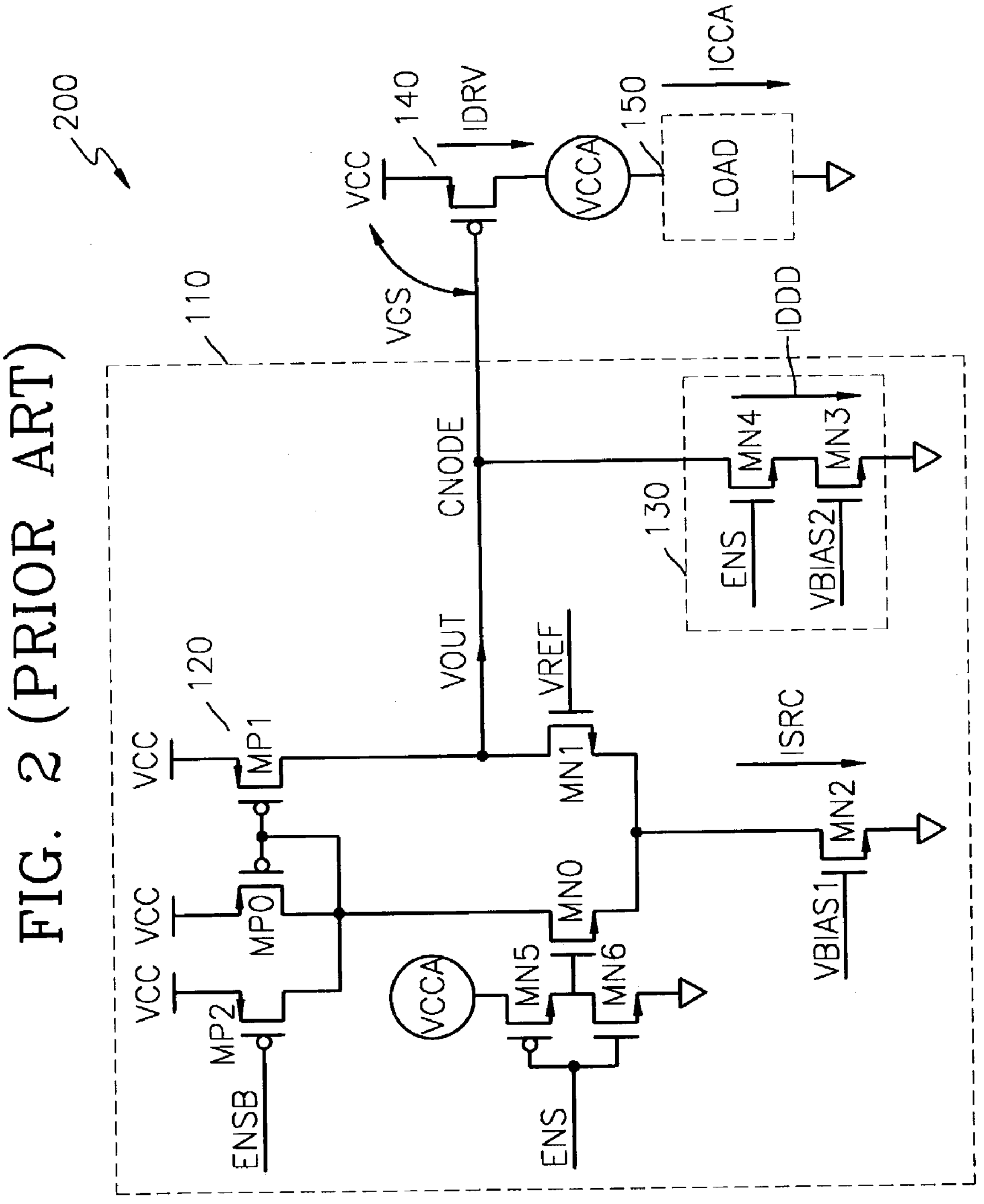
FIG. 2 (PRIOR ART)
FIG. 2 is circuit diagram of the voltage generating circuit of FIG. 1.
Figure 3:
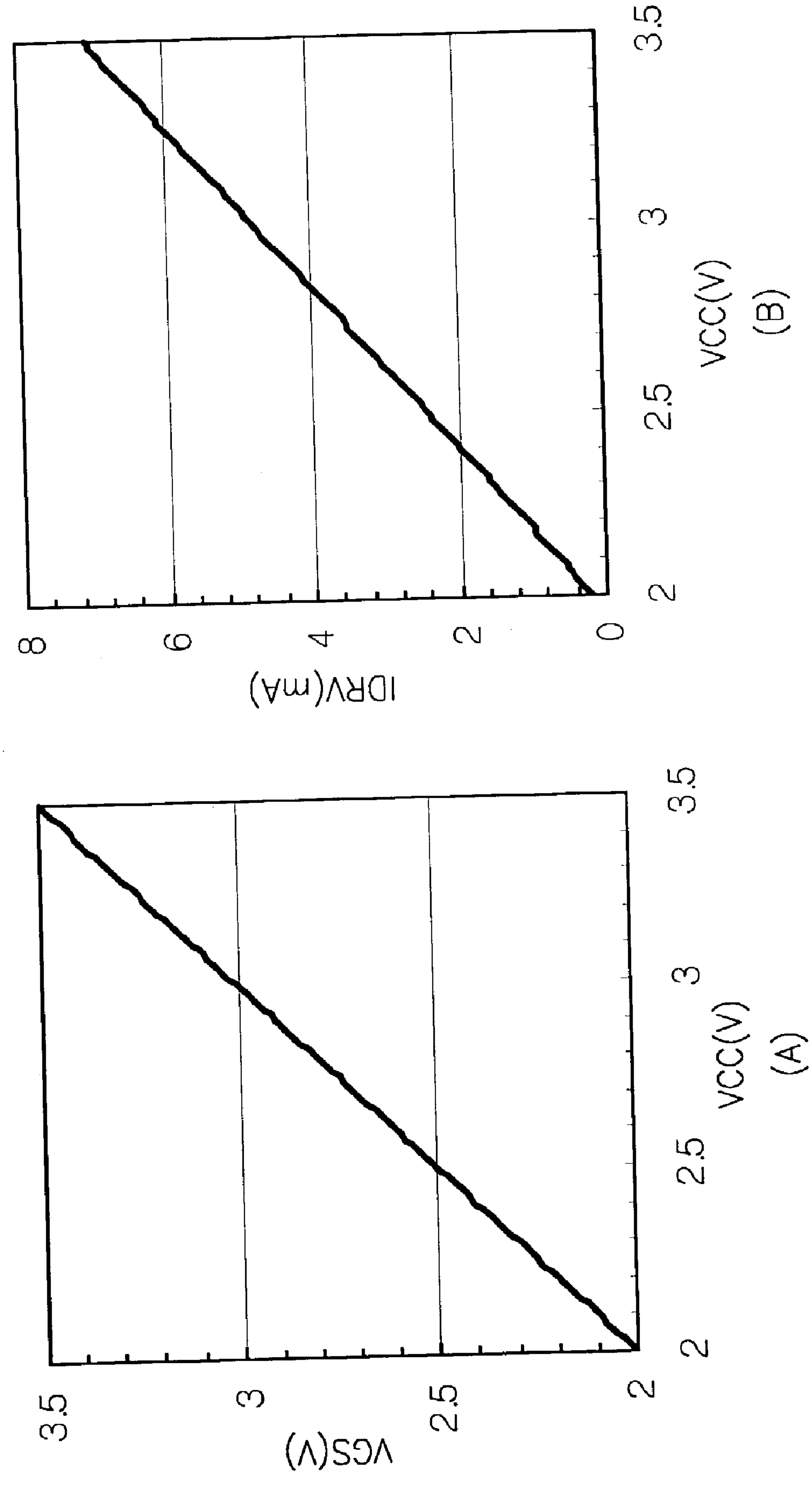
FIG. 3 (PRIOR ART)
FIGS. 3(*a*) and (*b*) are graphs showing the relationship between external voltage and gate source voltage in the voltage generating circuit of FIG. 1, and between the external voltage and a driving current.

Referring to FIG. 3(*a*), it is noted that an increase in the external voltage VCC results in an increase in voltage VGS between a gate and source of the internal voltage control circuit 140. As a result, the driving current IDRV is kept to increase. On the other hand, according to an exemplary embodiment the present invention, due to the clamp circuit 450, the voltage VGS between the gate and source of the internal voltage control circuit 440 does not increase above a desired value even if the external voltage VCC increases, thereby preventing a rise in the driving current IDRV.

The activation signal ENS is activated when a load current ICCA, which is consumed by the load 460, suddenly increases and the internal voltage VCCA is smaller than the reference voltage VREF. The activation of the activation signal ENS operates the voltage comparing circuit 410, and the internal voltage control circuit 440 is turned on by the output voltage VOUT output from the voltage comparing circuit 410. As a result, the driving current IDRV increases and the consumed load current ICCA is replenished.

At this time, a sudden increase in the external voltage VCC results in an increase in the driving current IDRV. Therefore, the internal voltage VCCA is not stably generated. To account for this instability, when the activation signal ENS is activated, the clamp circuit 450 is connected between the external voltage VCC and the control node CNODE, and controls the voltage in the control node CNODE to not to increase above a desired voltage. In another exemplary embodiment, the clamp circuit 450 includes a diode.

From FIG. 4(*b*), it is noted that a voltage VGS between the gate and source of the PMOS transistor 440 is constantly maintained as voltage VGS0.

FIG. 5(*a*) is an exemplary circuit diagram of the clamp circuit 450. In another exemplary embodiment, the clamp circuit 450 includes a first clamp PMOS transistor CMP1, a first clamp NMOS transistor CMN1, a second clamp PMOS transistor CMP2, and a third clamp PMOS transistor CMP3.

In this exemplary embodiment, when the activation signal ENS is activated, the first clamp NMOS transistor CMN1 and the second clamp PMOS transistor CMP2 are turned on, and the first clamp PMOS transistor CMP1 is turned off. Then, a gate of the third clamp PMOS transistor CMP3 is turned on, and a clamp current ICLAMP flows through the control node CNODE. Thus, voltage in the control node CNODE increases. For this reason, even if the external voltage VCC suddenly increases, the voltage VGS between the gate and source of the internal voltage control circuit 440, i.e., PMOS transistor, can be constantly maintained.

Referring to FIG. 5(*b*), the voltage VGS between the gate and source of the PMOS transistor 440 is preferably maintained to about 1.37 V. In fact, the voltage VGS, however, gradually increases above 1.37 V due to an increase in the clamp current ICLAMP.

Referring to FIG. 6(*a*), the voltage VGS between the gate and source of the PMOS transistor 440 is nearly constantly maintained irrespective of an increase in the external voltage VCC. Referring to FIG. 6(*b*), an increase in the driving voltage IDRV is suppressed although the external voltage VCC increases. That is, due to the use of the clamp circuit 450, the voltage VGS between the gate and source of the PMOS transistor 440, and the driving current IDRV are not affected by a variation in the external voltage VCC.

The clamp circuit 450 may be variously embodied, not being limited to the embodiment set forth in FIG. 5(*a*). Other implementations would also be known to one of ordinary skill in the art.

Figure 7:
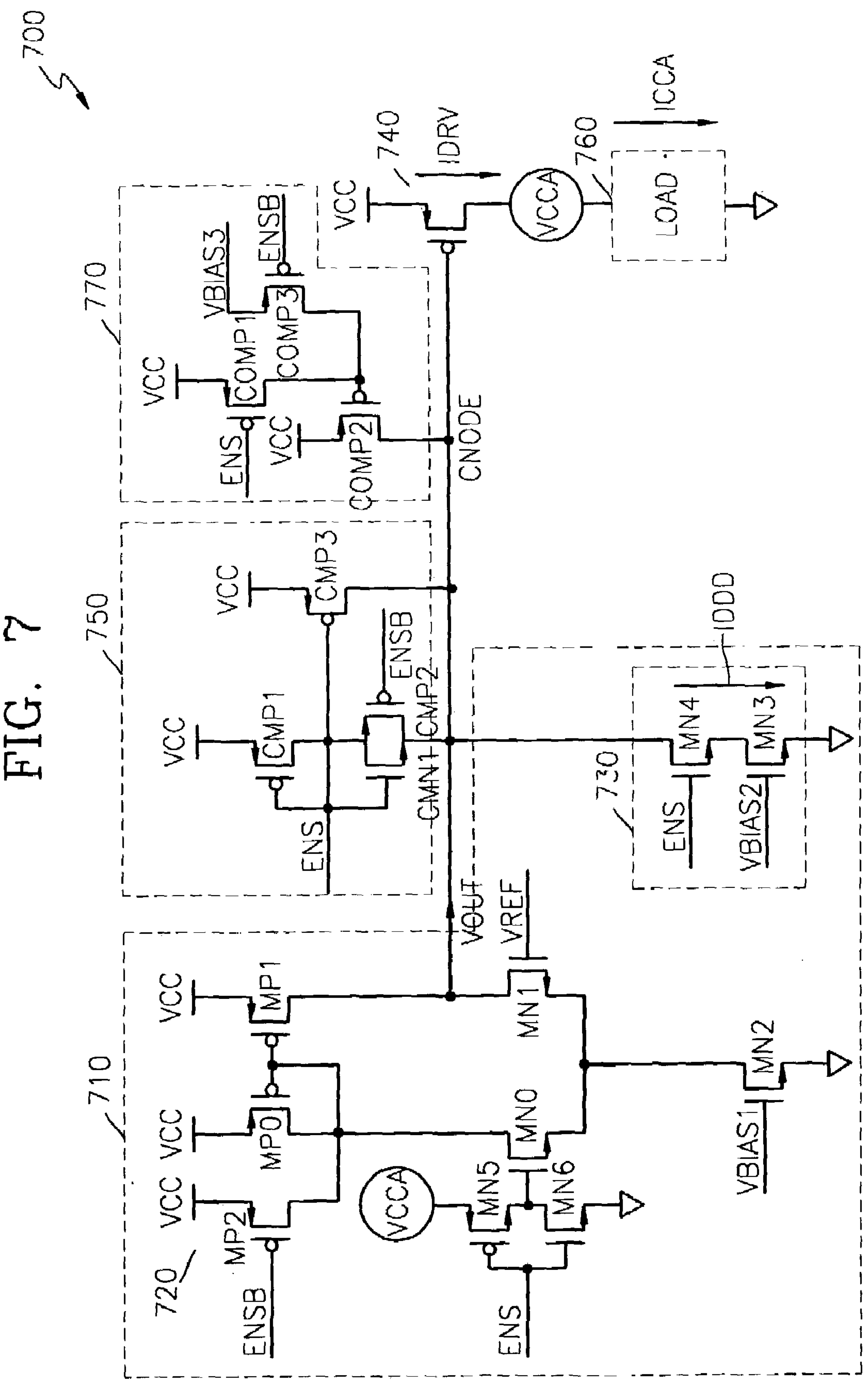
FIG. 7 is a circuit diagram of a voltage generating circuit further including a voltage compensating circuit according to an exemplary embodiment of the present invention.
Figure 8:
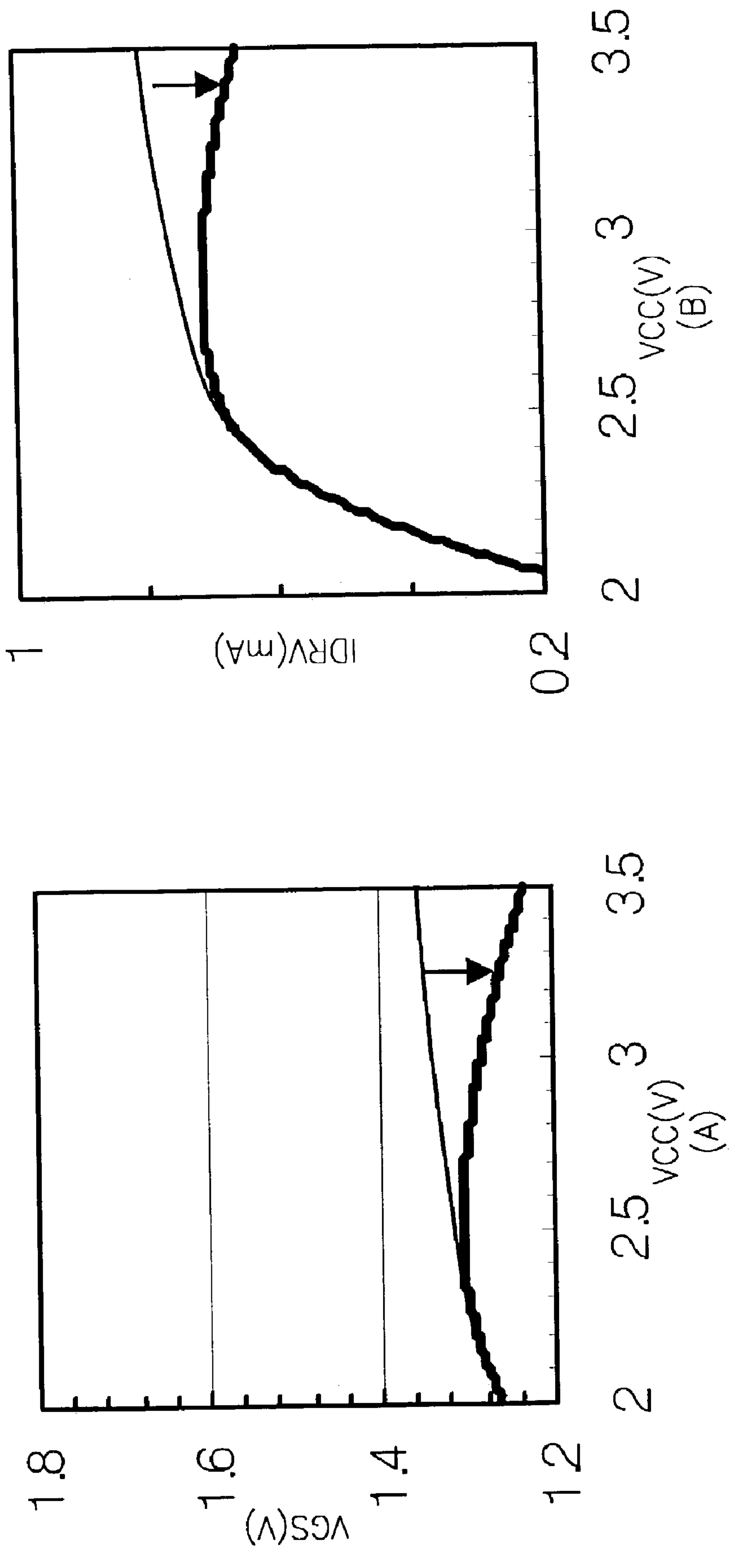
FIG. 8(*a*) is a graph showing the relationship between external voltage and gate source voltage of FIG. 1.

FIG. 7 is a circuit diagram of a voltage generating circuit in accordance with another exemplary embodiment, including a voltage compensating circuit 770. FIGS. 8(*a*) and (*b*) are views of the relationship between gate source voltage in an internal voltage generating circuit and an external voltage, and between an external voltage and a driving current.

The voltage comparing circuit 710 includes transistors MP0, MP1, MP2, MN0, MN1, MN2, MN3, MN4, MN5 and MN6, illustrated in FIG. 7.

The voltage compensating circuit 770 operates in response to an activation signal ENS, and controls voltage in a control node CNODE when the external voltage VCC reaches above a desired level so as to adjust the amount of the driving current IDRV. More specifically, the voltage compensating circuit 770 operates when the activation signal ENS is activated, and raises the voltage in the control node CNODE when the external voltage VCC reaches above a desired level, thereby suppressing an increase in the driving current IDRV.

In another exemplary embodiment, the voltage compensating circuit 770 includes first through third compensation PMOS transistors COMP1 through COMP3.

In another exemplary embodiment, a source and gate of the first compensation PMOS transistor COMP1 are connected to the external voltage VCC and the activation signal ENS, respectively. The second compensation PMOS transistor COMP2 has a source connected to the external voltage VCC, a gate connected to a drain of the first compensation PMOS transistor COMP1, and a drain connected to the control node CNODE. The third compensation PMOS transistor COMP3 has a source connected to a bias voltage BVIAS3, a gate connected to an inversion signal ENSB of the activation signal ENS, and a drain connected to the gate of the second compensation PMOS transistor COMP2.

Referring to FIG. 7, FIGS. 8(*a*) and (*b*), the operation of the exemplary voltage generating circuit 700 will now be described in detail, concentrating on the voltage compensating circuit 770.

When the activation signal ENS is activated to a high level, the first compensation PMOS transistor COMP1 is turned off, and the third compensation PMOS transistor COMP3 is turned on. Then, the bias voltage BVIAS3 is applied to the gate of the second compensation PMOS transistor COMP2. In another exemplary embodiment, the bias voltage VBIAS3 may be constantly kept to 1.6 V.

Because voltage in the gate of the second compensation PMOS transistor COMP2 is about 1.6 V, the second compensation PMOS transistor COMP2 is turned on when the external voltage VCC is more than about 2.3 V. Thus, when the external voltage VCC is more than about 2.3 V, an electric current is applied to the control node CNODE. As a result, voltage in the control node CNODE is raised. Therefore, despite an increase in the external voltage VCC, a continuous increase in the driving current IDRV is prevented.

In another exemplary embodiment, 2.3 V of the external voltage VCC is a value obtained by combining 1.6 V of gate voltage and 0.7 V of threshold voltage in the second compensation PMOS transistor COMP2.

Referring to FIG. 8(*a*), when the external voltage VCC is more than about 2.5V, a voltage VGS between the gate and source of a PMOS transistor 740 gradually decreases.

Figure 9:
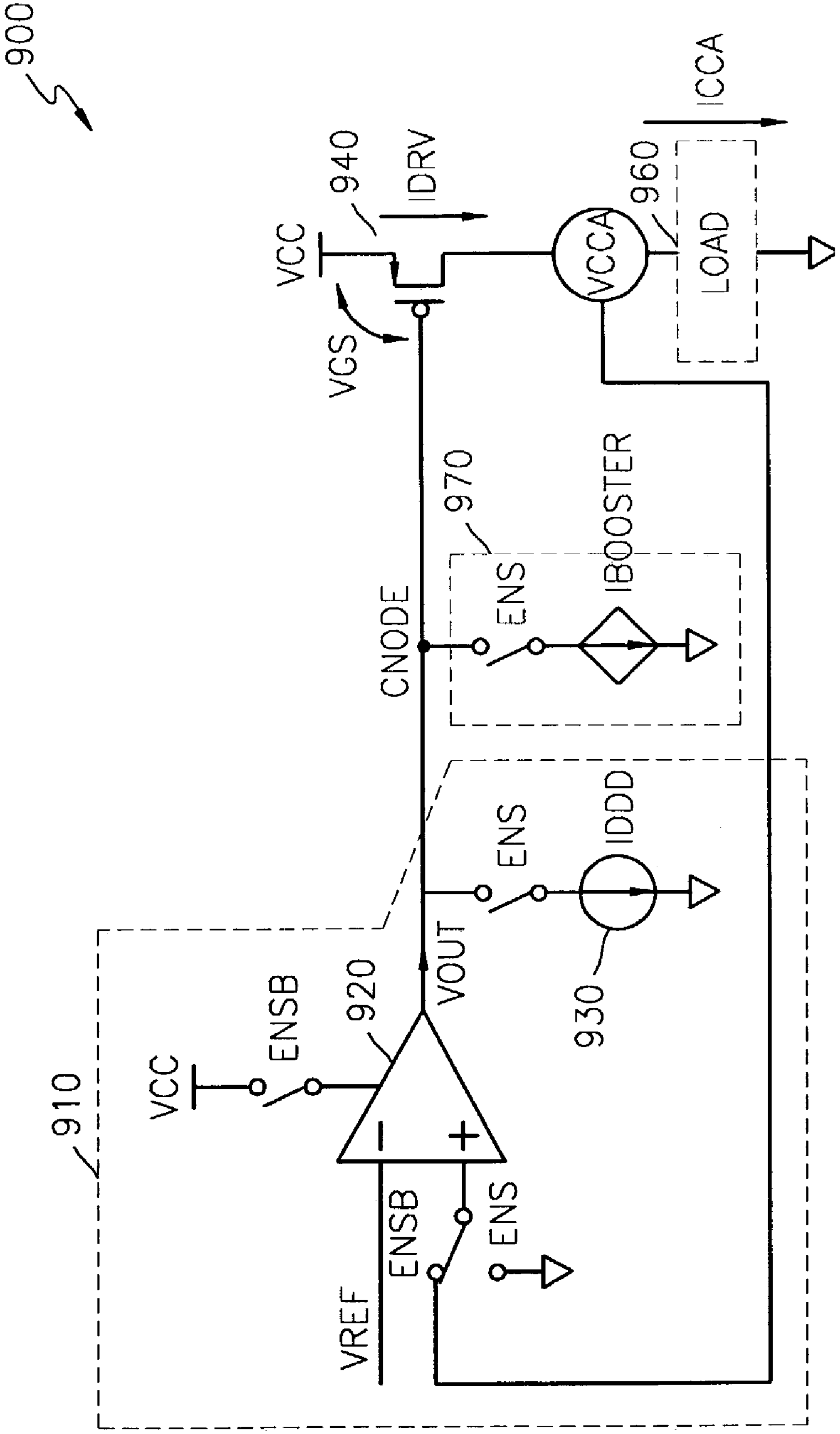
FIG. 9 is a view of another exemplary embodiment of a voltage generating circuit according to the present invention.
Figure 10:
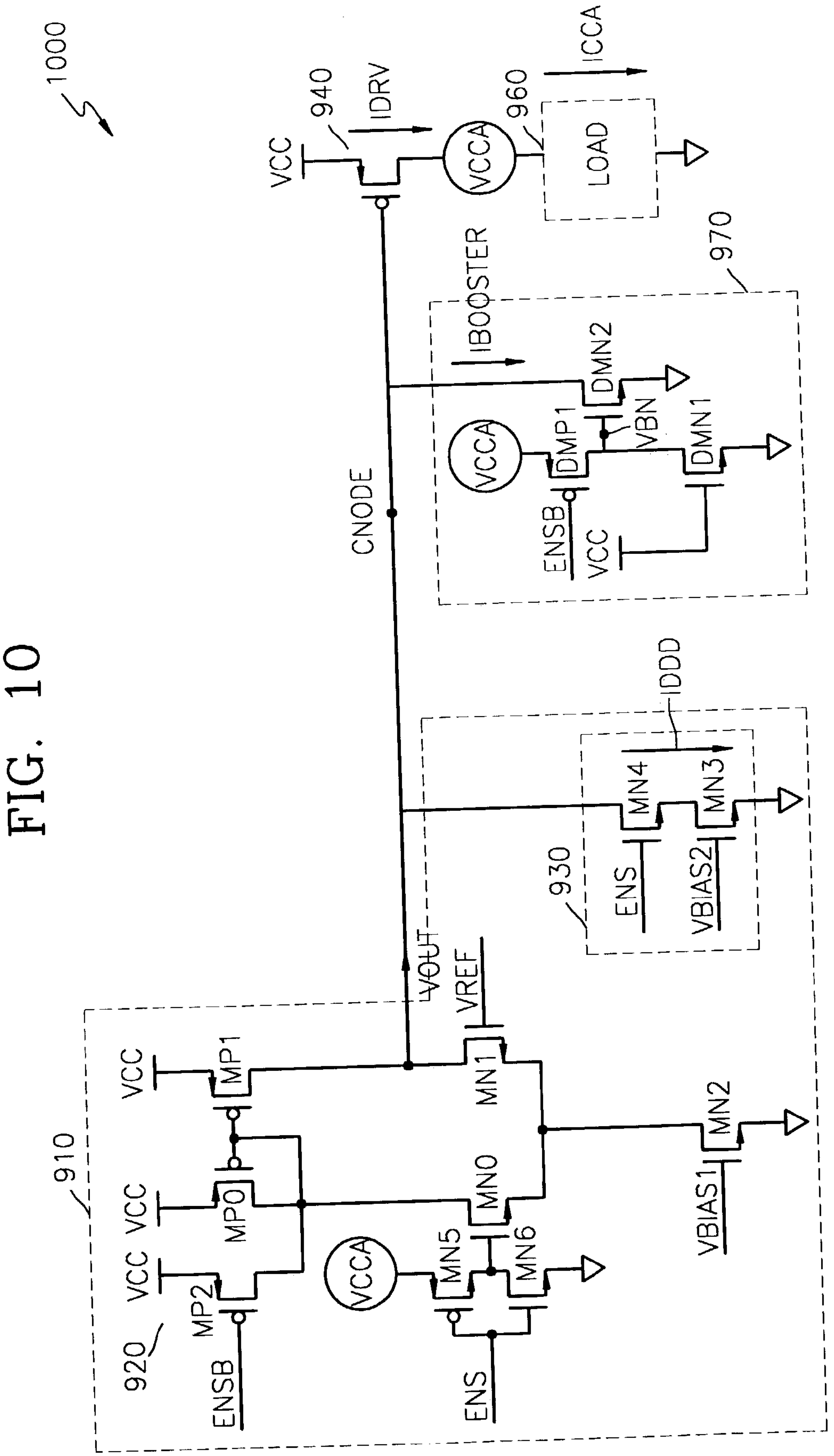
FIG. 10 is a circuit diagram of the voltage generating circuit of FIG. 9.
Figure 11:
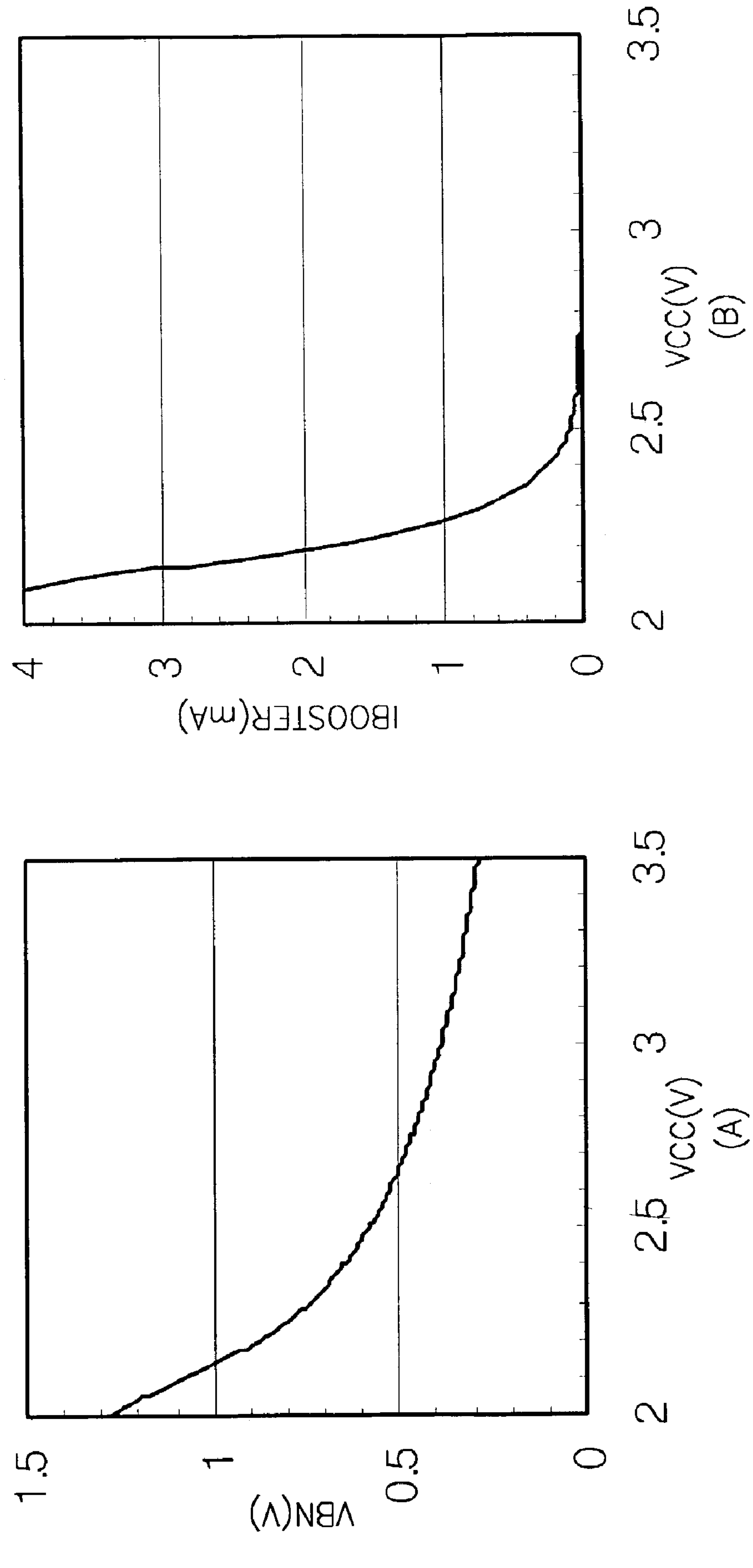
FIGS. 11(*a*) and (*b*) are graphs showing the relationship between external voltage in the voltage generating circuit of FIG. 9 and a booster current in a voltage drop circuit, and between the external voltage and booster voltage in the voltage drop circuit.
Figure 12:
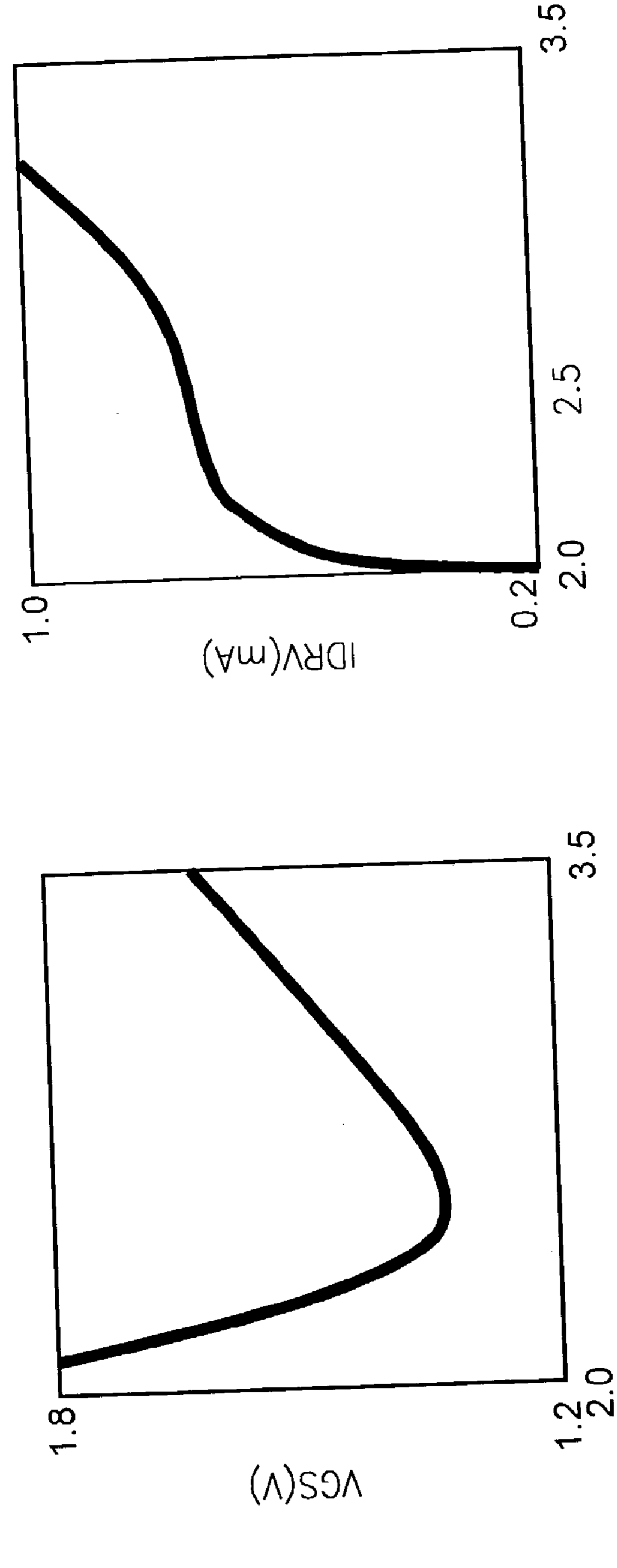
FIGS. 12(*a*) and (*b*) are graphs showing the relationship between external voltage and gate source voltage in an internal voltage generating circuit, and between the external voltage and a driving current in the voltage generating circuit of FIG. 9.

FIG. 9 is a view of another exemplary embodiment of a voltage generating circuit 900 according to the present invention. FIG. 10 is an exemplary circuit diagram of the voltage generating circuit 900 of FIG. 9. FIGS. 11(*a*) and (*b*) are graphs showing the relationship between an external voltage in the voltage generating circuit 900 and a booster current in a voltage drop circuit 970, and between the external voltage and booster voltage. FIGS. 12(*a*) and (*b*) are graphs illustrating the relationship between external voltage in the voltage generating circuit 900 of FIG. 9 and gate source voltage in an internal voltage generating circuit, and between the external voltage and a driving current.

Another exemplary embodiment of a voltage generating circuit according to the present invention includes a voltage comparing circuit 910, an internal voltage control circuit 940, and the voltage drop circuit 970.

The voltage comparing circuit 910 includes transistors MP0, MP1, MP2, MN0, MN1, MN2, MN3, MN4, MN5 and MN6, illustrated in FIG. 10.

The voltage comparing circuit 910 operates in response to an activation signal ENS, and outputs output voltage VOUT in response to a difference between reference voltage VREF and internal voltage VCCA to a control node CNODE. In another exemplary embodiment, the activation signal ENS is activated in response to the operation timing of a load 960.

The internal voltage control circuit 940 receives external voltage VCC, is connected to the control node CNODE, and controls the level of the internal voltage VCCA applied to the load 960 in response to a voltage at the control node CNODE.

In another exemplary embodiment, the internal voltage control circuit 940 is a PMOS transistor whose source and gate are connected to the external voltage VCC and the control node CNODE, respectively, and that generates the internal voltage VCCA in its drain.

The voltage drop circuit 970 operates in response to the activation signal ENS, and controls the level of voltage in the control node CNODE to adjust the amount of the driving current IDRV flowing through the voltage control circuit 940 when the external voltage VCC reaches below a desired level. That is, the voltage drop circuit 970 operates in response to the activation signal ENS, and increase the driving current IDRV by dropping the voltage at the control node CNODE when the external voltage VCC reaches a desired level.

In another exemplary embodiment, the voltage drop circuit 970 includes first drop PMOS transistor DMP1, a first drop NMOS transistor DMN1, and a second drop NMOS transistor DMN2.

The first drop PMOS transistor DMP1 has a source connected to the internal voltage VCCA, and a gate connected to an inversion signal ENSB of the activation signal ENS. The first drop NMOS transistor DMN1 has a drain connected to a drain of the first drop PMOS transistor DMP1, a gate connected to the external voltage VCC, and a source connected to the ground. The second drop NMOS transistor DMN2 has a drain connected to the control node CNODE, a gate connected to the drain of the first drop PMOS transistor DMP1, and a source connected to the ground.

Hereinafter, another exemplary embodiment of a voltage generating circuit according to the present invention will be described with reference to FIGS. 9 through FIG. 12(*b*).

In the event that the external voltage VCC is less than 2.5 V, the driving current IDRV can be increased by lowering voltage in the control node CNODE so that voltage VGS between a gate and source of the PMOS transistor 940 is increases. That is, the voltage drop circuit 970 is required in lowering the voltage in the control node CNODE when the external voltage VCC is less than about 2.5 V.

If the activation signal ENS is activated to a high level and the external voltage VCC drops to less than about 2.5 V, the first drop NMOS transistor DMN1 is turned off and the first drop PMOS transistor DMP1 is turned on, thereby raising booster voltage VBN which gate voltage of the second drop NMOS transistor DMN2, as shown in FIG. 11(*a*).

As indicated in FIG. 11(*b*), an increase in the booster voltage VBN results in frequent turning on of the second drop NMOS transistor DMN2, and an increase in a booster current IBOOSTER. As the booster current IBOOSTER increases, the voltage in the control node CNODE decreases and the voltage VGS between the gate and source of the PMOS transistor 940 increases, which raises the driving current IDRV.

Accordingly, even if the external voltage VCC is less than about 2.5 V, it is possible to prevent rapid dropping of the driving current IDRV, and lengthen a section in which the driving current IDRV is maintained to a desired level. This is illustrated in FIG. 12(*b*).

A voltage generating circuit 1000 including the voltage drop circuit 970 is advantageous in that it can lengthen a section in which the internal voltage VCCA, which is generated by the voltage generating circuit 1000, is constantly maintained when the driving capability of the internal voltage VCCA is lowered due to the low external voltage VCC.

In addition to the voltage compensating circuit 910 and the internal voltage control circuit 940, the voltage generating circuit 1000 may further include only the voltage drop circuit 970, or both a clamp circuit and the voltage drop circuit 970.

Figure 13:
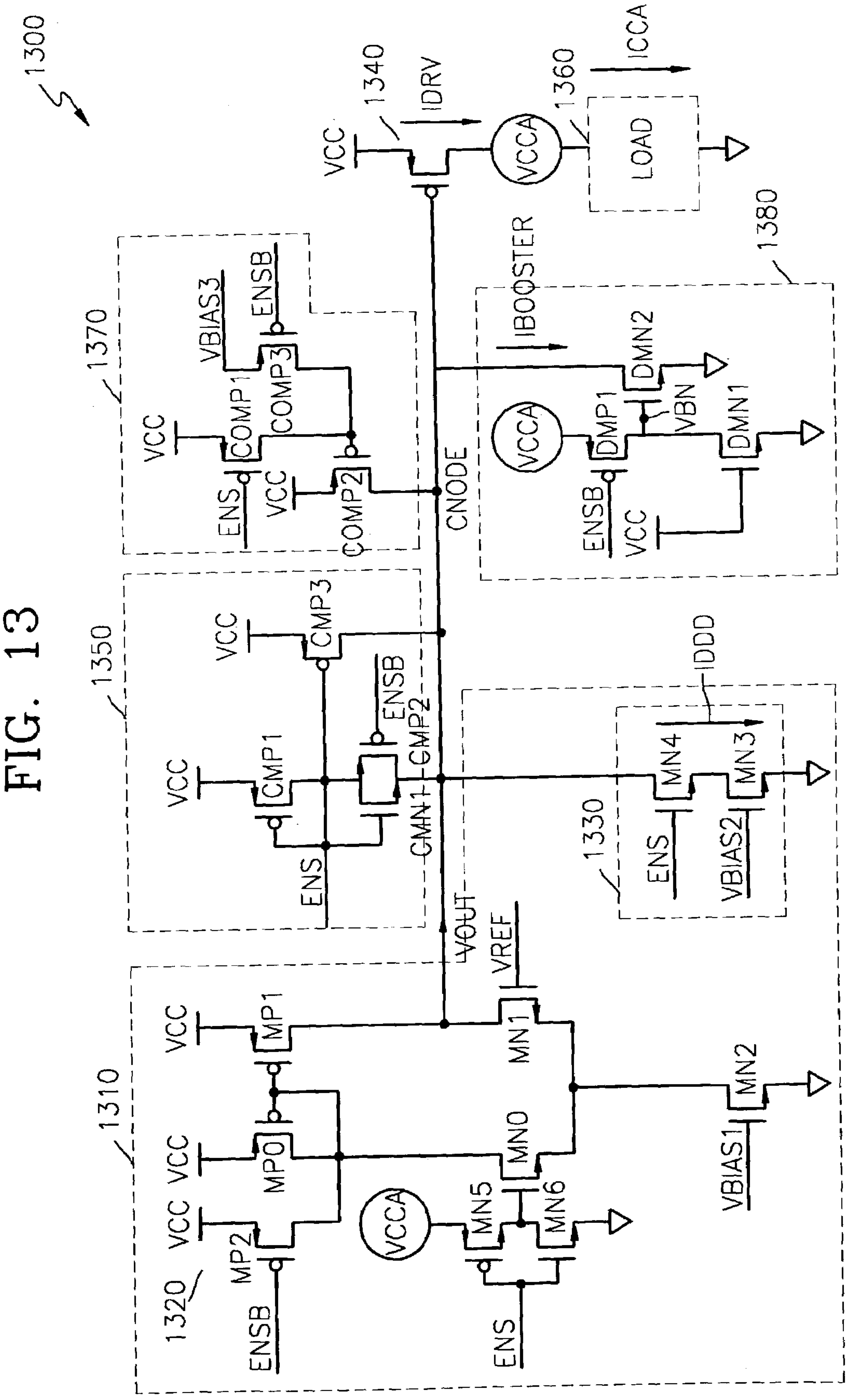
FIG. 13 is a view of another exemplary embodiment of a voltage generating circuit according to the present invention.
Figure 14:
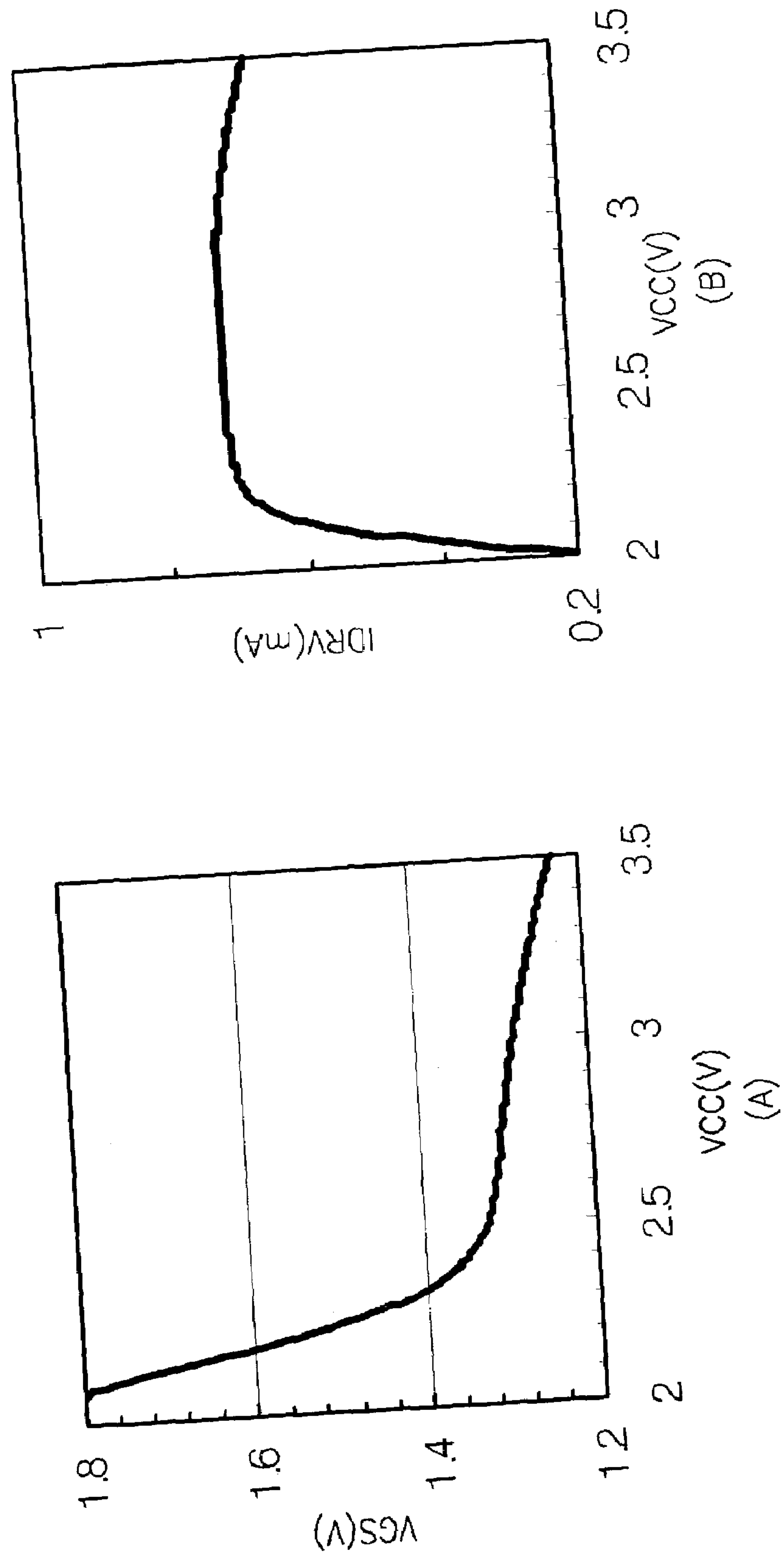
FIGS. 14(*a*) and (*b*) are graphs showing the relationship between external voltage and gate source voltage in an internal voltage generating circuit, and between the external voltage and a driving current in the voltage generating circuit of FIG. 13.

FIG. 13 is a view of a circuit generating circuit 1300 according to another exemplary embodiment of the present invention. FIGS. 14(*a*) and (*b*) are graphs illustrating the relationship between external voltage in the voltage generating circuit 1300 and gate source voltage in an internal voltage generating circuit, and between the external voltage and a driving current.

The voltage comparing circuit 1310 includes transistors MP0, MP1, MP2, MN0, MN1, MN2, MN3, MN4, MN5 and MN6, illustrated in FIG. 13.

In another exemplary embodiment, the voltage generating circuit 1300 includes a voltage comparing circuit 1310, an internal voltage control circuit 1340, a clamp circuit 1350 and a voltage drop circuit 1380.

In another exemplary embodiment, the voltage comparing circuit 1310 operates in response to an activation signal ENS, and outputs output voltage VOUT to a control node CNODE in response to a difference between reference voltage VREF and internal voltage VCCA. In another exemplary embodiment, the activation signal ENS is activated in response to the operation timing of a load 1360.

In another exemplary embodiment, the internal voltage control circuit 1340 receives the external voltage VCC, is connected to the control node CNODE, and controls the level of the internal voltage VCCA applied to the predetermined load 1360 in response to voltage in the control node CNODE. The internal voltage control circuit 1340 is a PMOS transistor whose source and gate are connected to the external source VCC and the control node CNODE, and that generates the internal voltage VCCA in its drain.

In another exemplary embodiment, the clamp circuit 1350 controls the voltage in the control node CNODE so as to adjust the amount of the driving current IDRV flowing through the internal voltage control circuit 1340. In another exemplary embodiment, the driving current IDRV is a source-drain current of a PMOS transistor.

In another exemplary embodiment, the clamp circuit 1350 includes a diode whose first end connected to the external voltage VCC and whose second end controlled to be connected in response to the activation signal ENS, and that controls the voltage in the control node CNODE not to increase above a desired voltage.

In another exemplary embodiment, the clamp circuit 1350 includes a first clamp PMOS transistor CMP1, a first clamp NMOS transistor CMN1, a second clamp PMOS transistor CMP2, and a third clamp PMOS transistor CMP3.

In another exemplary embodiment, a source and gate of the first clamp PMOS transistor CMP1 are connected to the external voltage VCC and the activation signal ENS, respectively. A drain, gate and source of the first clamp NMOS transistor CMN1 are connected to a drain of the first clamp PMOS transistor CMP1, the activation signal ENS, and the control node CNODE, respectively.

In another exemplary embodiment, the second clamp PMOS transistor CMP2 has a source connected to the drain of the first clamp PMOS transistor CMP1, a gate connected to an inversion signal ENSB of the activation signal ENS, and a drain connected to the control node CNODE. The third clamp PMOS transistor CMP3 has a source connected to the external voltage VCC, a gate connected to the drain of the first clamp PMOS transistor CMP1, and a drain connected to the control node CNODE.

The voltage drop circuit 1380 operates in response to the activation signal ENS, and adjusts the amount of the driving current IDRV by controlling the level of voltage in the control node CNODE when the external voltage VCC is less than a desired level. More specifically, the voltage drop circuit 1380 operates in response to the activation signal ENS, increases the driving current IDRV by lowering the voltage in the control node CNODE when the external voltage VCC reaches below a desired level.

In another exemplary embodiment, the voltage drop circuit 1380 includes a first drop PMOS transistor DMP1, a first drop NMOS transistor DMN1, and a second drop NMOS transistor DMN2.

The first drop PMOS transistor DMP1 has a source connected to the internal voltage VCCA and a gate connected to an inversion signal ENSB of the activation signal ENS. The first drop NMOS transistor DMN1 has a drain connected to the drain of a drain of the first drop PMOS transistor DMP1, a gate connected to the external voltage VCC, and a source connected to the ground. The second drop NMOS transistor DMN2 has a drain connected to the control node CNODE, a gate connected to the drain of the first drop PMOS transistor DMP1, and a source connected to the ground.

The voltage generating circuit 1300 may further include a voltage compensating circuit 1370 that operates in response to the activation signal ENS and controls the voltage in the control node CNODE so as to adjust the amount of the driving current IDRV when the external voltage VCC reaches above a predetermined level. In another exemplary embodiment, the voltage compensation circuit 1370 increases the voltage in the control node CNODE to suppress a rise in the driving current IDRV when the external voltage VCC reaches above a desired level.

In another exemplary embodiment, the voltage compensating circuit 1370 includes a first compensating PMOS transistor COMP1, a second compensating PMOS transistor COMP2, and a third PMOS transistor COMP3.

In another exemplary embodiment, the first compensating PMOS transistor COMP1 has a source connected to the external voltage VCC and a gate connected to the activation signal ENS. The second compensating PMOS transistor COMP2 has a source connected to the external voltage VCC, a gate connected to drains of the first and third compensating PMOS transistor COMP1 and COMP3, and a drain connected to the control node CNODE. The third compensating PMOS transistor COMP3 has a source connected to a bias voltage VBIAS3, a gate connected to an inversion signal ENSB of the activation signal ENS, and a drain connected to the gate of the second compensating PMOS transistor COMP2.

The operation of a voltage generating circuit 1300 according to another exemplary embodiment of the present invention will now be described with reference to FIG. 13, FIGS. 14(*a*) and (*b*). The voltage generating circuit 1300 is one that is combined with the voltage generating circuit 400 and the voltage generating circuit 900 according to previously discussed exemplary embodiments.

In another exemplary embodiment, the clamp circuit 1350 suppresses an increase in a driving current IDRV by controlling voltage VSG between a gate and source between the PMOS transistor 1340 not to increase above a desired level.

The voltage compensating circuit 1370 is capable of preventing increasing of the voltage VGS between the gate and source of the PMOS transistor 1340, and increasing of the driving current IDRV, independently with an increase in the external voltage VCC to a desired level.

However, in the event that the external voltage VCC is less than a desired voltage, so that the voltage VGS between the gate and source of the PMOS transistor 1340 is increased. As a result, even if the external voltage VCC becomes lower than a desired voltage, due to an increase in the driving current IDRV, the lowered driving current IDRV can be compensated for.

In summary, with the use of the clamp circuit 1350, the voltage compensating circuit 1370 and the voltage drop circuit 1380, the voltage generating circuit 1300 according to a third embodiment of the present invention is capable of constantly maintaining the internal voltage VCCA, which is generated by the voltage generating circuit 1300, even if the external voltage VCC is more than or less than a desired voltage, e.g., about 2.5 V, as indicated in FIGS. 14(*a*) and (*b*).

As described above, a voltage generating circuit according to various embodiments of the present invention can generate stable internal voltage irrespective of a variations in external voltage.

While the present invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A voltage generating circuit for generating a stable internal voltage irrespective of a variation in external voltage, the voltage generating circuit comprising:

a voltage comparing circuit operating in response to an activation signal and for outputting an output voltage to a control node in response to a difference between a reference voltage and an internal voltage;

an internal voltage control circuit connected to the control node, the internal voltage control circuit receiving the external voltage and controlling a level of the internal voltage, which is applied to a load, in response to a voltage level at the control node; and a clamp circuit for adjusting an amount of driving current flowing through the internal voltage control circuit by maintaining control of the voltage level at the control node below a voltage threshold, wherein the clamp circuit comprises:

a first clamp PMOS transistor having a source connected to the external voltage and a gate connected to the activation signal; and a first clamp NMOS transistor having a source connected to a drain of the first clamp PMOS transistor, a gate connected to the activation signal, and a source connected to the control node.

2. The voltage generating circuit of claim 1, wherein at least one of the first clamp transistors is configured as a diode.

3. The voltage generating circuit of claim 1, further comprising a voltage compensating circuit operating in response to the activation signal and for adjusting the amount of driving current by increasing the voltage level at the control node in the event that the external voltage exceeds the threshold voltage.

4. The voltage generating circuit of claim 3, wherein the voltage compensating circuit operates in response to the activation signal and suppresses an increase in the driving current flowing through the internal voltage control circuit by raising the voltage level at the control node when the external voltage is higher than the threshold voltage.

5. The voltage generating circuit of claim 1, wherein the internal voltage control circuit includes a PMOS transistor having a source connected to the external voltage and a gate connected to the control node and that generates the internal voltage at its drain.

6. The voltage generating circuit of claim 5, wherein the driving current is a source-drain current of the PMOS transistor.

7. The voltage generating circuit of claim 1, wherein the activation signal is activated in response to an operation timing of the load.

8. The voltage generating circuit of claim 1, further comprising:

a second clamp PMOS transistor having a source connected to the drain of the first clamp PMOS transistor, a gate connected to an inversion signal of the activation signal, and a drain connected to the control node.

9. The voltage generating circuit of claim 8, further comprising:

a third clamp PMOS transistor having a source connected to the external voltage, a gate connected to the drain of the first clamp PMOS transistor, and a drain connected to the control node.

10. A voltage generating circuit for generating a stable internal voltage irrespective of a variation in external voltage, the voltage generating circuit comprising:

a voltage comparing circuit operating in response to an activation signal and for outputting an output voltage to a control node in response to a difference between a reference voltage and the internal voltage;

an internal voltage control circuit connected to the control node, the internal voltage control circuit receiving the external voltage and controlling a level of the internal voltage, which is applied to a load, in response to a voltage level at the control node;

a clamp circuit for adjusting an amount of driving current flowing through the internal voltage control circuit by maintaining control of the voltage level at the control node below a voltage threshold; and a voltage compensating circuit operating in response to the activation signal and for adjusting the amount of driving current by increasing the voltage level at the control node in the event that the external voltage exceeds the threshold voltage, where in the voltage compensating circuit comprises:

a first compensating PMOS transistor having a source to the external voltage and a gate connected to the activation signal;

a second compensating PMOS transistor having a source connected to the external voltage, a gate connected to a drain of the first compensating PMOS transistor, and a drain connected to the control node; and a third compensating PMOS transistor having a source connected to a bias voltage, a gate connected to an inversion signal of the activation signal, and a drain connected to the gate of the second compensating PMOS transistor.

11. A voltage generating circuit for generating a stable internal voltage irrespective of a variation in external voltage, the voltage generating circuit comprising:

a voltage comparing circuit operating in response to an activation signal and for outputting an output voltage to a control node in response to a difference between a reference voltage and the internal voltage;

an internal voltage control circuit connected to the control node, the internal voltage control circuit receiving the external voltage and controlling a level of the internal voltage, which is applied to a load, in response to a voltage level at the control node;

a clamp circuit for adjusting an amount of driving current flowing through the internal voltage control circuit by maintaining control of the voltage level at the control node below a threshold; and a voltage compensating circuit operating in response to the activation signal and for adjusting the amount of driving current flowing through the internal voltage control circuit by controlling the voltage level at the control node in the event that the external voltage is lower than a desired voltage, wherein the clamp circuit comprises:

a first clamp PMOS transistor having a source to the external voltage and a gate connected to the activation signal; and a first clamp NMOS transistor having a source connected to a drain of the first clamp PMOS transistor, a gate connected to the activation signal, and a source connected to the control node.

12. The voltage generating circuit of claim 11, wherein at least one of the first clamp transistors is configured as a diode.

13. The voltage generating circuit of claim 11, wherein the voltage drop circuit operates in response to the activation signal and increase the driving current by dropping the voltage level at the control node in the event that the external voltage is lower than a desired voltage.

14. The voltage generating circuit of claim 11, further comprising a voltage compensating circuit operating in response to the activation signal and for adjusting the amount of the driving current flowing through the internal voltage control circuit by increasing the voltage level at the control node when the external voltage is higher than the desired voltage.

15. The voltage generating circuit of claim 14, wherein the voltage compensating circuit operates in response to the activation signal and suppresses an increase in the driving current by raising the voltage level at the control node in the event that the external voltage exceeds the desired voltage.

16. The voltage generating circuit of claim 11, wherein the internal voltage control circuit is a PMOS transistor having a source connected to the external voltage and a gate connected to the control node and that generates the internal voltage at its drain.

17. The voltage generating circuit of claim 11, wherein the driving current is a source-drain current of a PMOS transistor.

18. The voltage generating circuit of claim 11, wherein the activation signal is activated in response to an operation timing of the load.

19. The voltage generating circuit of claim 11, further comprising:

a second clamp PMOS transistor having a source connected to the drain of the first clamp PMOS transistor, a gate connected to an inversion signal of the activation signal, and a drain connected to the control node.

20. The voltage generating circuit of claim 19, further comprising:

a third clamp PMOS transistor having a source connected to the external voltage, a gate connected to an drain of the first clamp PMOS transistor, and a drain connected to the control node.

21. A voltage generating circuit for generating a stable internal voltage irrespective of a variation in external voltage, the voltage generating circuit comprising:

a voltage comparing circuit operating in response to an activation signal and for outputting an output voltage to a control node in response to a difference between a reference voltage and the internal voltage;

an internal voltage control circuit connected to the control node, the internal voltage control circuit receiving the external voltage and controlling a level of the internal voltage, which is applied to a load, in response to a voltage level at the control node;

a clamp circuit for adjusting an amount of driving current flowing through the internal voltage control circuit by maintaining control of the voltage level at the control node below a threshold; and a voltage compensating circuit operating in response to the activation signal and for adjusting the amount of driving current flowing through the internal voltage control circuit by controlling the voltage level at the control node in the event that the external voltage is lower than a desired voltage, wherein the clamp circuit comprises:

a first clamp PMOS transistor having a source to the external voltage and a gate connected to the activation signal;

a first drop NMOS transistor having a drain connected to a drain of the first drop PMOS transistor, a gate connected to the external voltage, and a source connected to the ground; and a second drop NMOS transistor having a drain connected to the control node, a gate connected to the drain of the first drop PMOS transistor, and a source connected to the ground.

22. A voltage generating circuit for generating a stable internal voltage irrespective of a variation in external voltage, the voltage generating circuit comprising:

a voltage comparing circuit operating in response to an activation signal and for outputting an output voltage to a control node in response to a difference between a reference voltage and the internal voltage;

an internal voltage control circuit connected to the control node, the internal voltage control circuit receiving the external voltage and controlling a level of the internal voltage, which is applied to a load, in response to a voltage level at the control node;

a clamp circuit for adjusting an amount of driving current flowing through the internal voltage control circuit by maintaining control of the voltage level at the control node below a threshold; and a voltage compensating circuit operating in response to the activation signal and for adjusting the amount of driving current flowing through the internal voltage control circuit by controlling the voltage level at the control node when the external voltage is higher than a desired voltage, wherein the clamp circuit comprises:

a first compensating PMOS transistor having a source to the external voltage and a gate connected to the activation signal;

a second compensating PMOS transistor having a source connected to the external voltage, a gate connected to a drain of the first compensating PMOS transistor, and a drain connected to the control node; and a third compensating PMOS transistor having a source connected to a bias voltage, a gate to an inversion signal of the activation signal, and a drain connected to the gate of the compensating PMOS transistor.

* * * * *